(12) United States Patent
Campbell et al.

(10) Patent No.: US 7,078,337 B2
(45) Date of Patent: Jul. 18, 2006

(54) SELECTIVE ISOTROPIC ETCH FOR TITANIUM-BASED MATERIALS

(75) Inventors: Timothy S. Campbell, Gotha, FL (US); Daniel P. Chesire, Winter Garden, FL (US); Kelly Hinckley, Orlando, FL (US); Gregory A. Head, Orlando, FL (US); Benu B. Patel, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/675,263

(22) Filed: Sep. 30, 2003

(65) Prior Publication Data

US 2005/0068608 A1    Mar. 31, 2005

(51) Int. Cl.
*H01L 29/40* (2006.01)
(52) U.S. Cl. ...................... 438/639; 438/689
(58) Field of Classification Search ........ 438/624–638, 438/723–725, 121, 978, 215
See application file for complete search history.

(56) References Cited

U.S. PATENT DOCUMENTS

| | | | |
|---|---|---|---|
| 4,560,458 A * | 12/1985 | Ueno et al. | |
| 5,326,427 A | 7/1994 | Jerbic | |
| 5,376,236 A | 12/1994 | Hanson et al. | |
| 5,399,237 A | 3/1995 | Keswick et al. | |
| 5,413,670 A | 5/1995 | Langan et al. | |
| 5,445,710 A * | 8/1995 | Hori et al. | |
| 5,872,061 A * | 2/1999 | Lee et al. | |
| 5,872,062 A | 2/1999 | Hsu | |
| 6,117,786 A | 9/2000 | Khajehnouri et al. | |
| 6,197,610 B1 | 3/2001 | Toda | |
| 6,200,735 B1 | 3/2001 | Ikegami | |
| 6,342,449 B1 * | 1/2002 | Miyakawa | |
| 6,531,404 B1 | 3/2003 | Nallan et al. | |
| 6,693,038 B1 * | 2/2004 | Shen | |
| 6,720,256 B1 * | 4/2004 | Wu et al. | 438/638 |
| 6,827,869 B1 * | 12/2004 | Podlesnik et al. | 216/17 |
| 2002/0001963 A1 | 1/2002 | Tadokoro et al. | |
| 2003/0024902 A1 | 2/2003 | Li et al. | |

FOREIGN PATENT DOCUMENTS

DE    198 47 455 A 1    4/2000

OTHER PUBLICATIONS

Lester, Maria A.; "Selective Material Removal for Nanostructure Formation"; Semiconductor International; www.e-insite.net; Jun. 21, 2003.
Clark, Peter; "MEMS Poised to Move Into the Mainstream"; EE Times; www.eetimes.com; Sep. 12, 2002.

* cited by examiner

*Primary Examiner*—Fetsum Abraham

(57) ABSTRACT

A process for etching a sacrificial layer of a structure. The structure is exposed to a plasma derived from nitrogen trifluoride for etching the sacrificial layer. The process is selective in that it etches titanium-nitride and titanium but does not affect adjacent silicon dioxide or aluminum layers. Applications of the process include the formation of integrated circuit structures and MEMS structures.

32 Claims, 8 Drawing Sheets

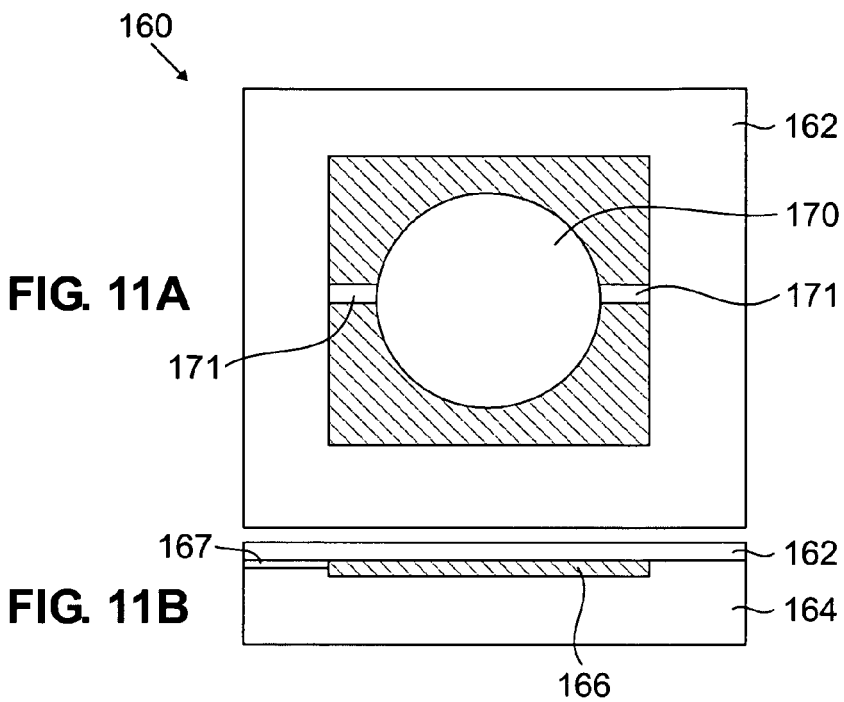
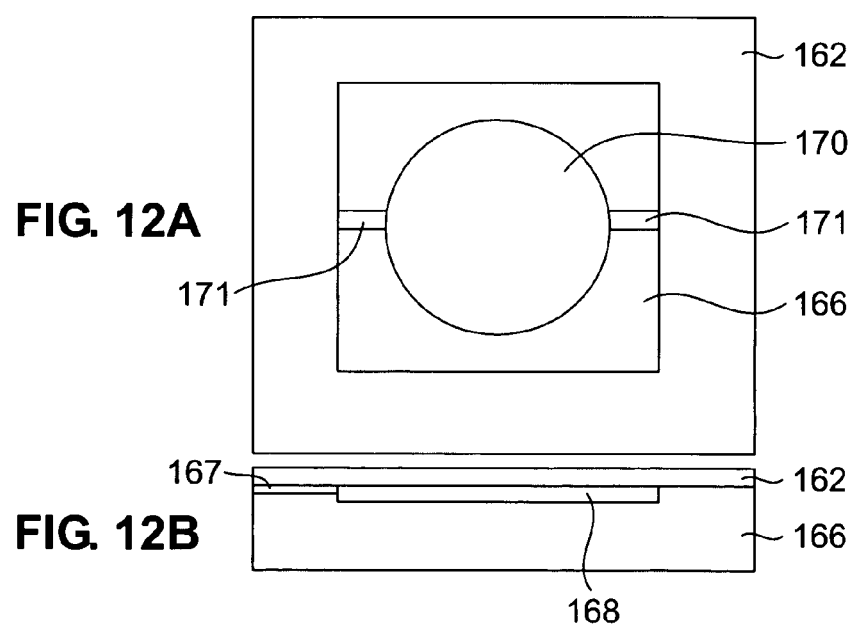

SELECTIVE ISOTROPIC ETCH FOR TITANIUM-BASED MATERIALS

FIELD OF THE INVENTION

The present invention relates generally to etching material layers in a semiconductor or microelectromechanical systems device, and more specifically to a process for etching titanium-based layers (including titanium-nitride) in such devices.

BACKGROUND OF THE INVENTION

Microelectromechanical (MEM) systems comprise integrated micro devices, such as mechanical components, formed on a substrate material. The systems, which are fabricated using integrated circuit batch processing techniques, range in size from nanometers to millimeters. MEMS devices are operable individually to sense, control, and actuate on a micro scale, or can function in arrays to generate effects on a macro scale. Current MEMS device applications include accelerometers, inertial and angular sensors, pressure sensors, chemical and flow sensors, micro-optics devices, optical scanners, fluid flow devices, chemical sensing and chemical delivery systems, and biological sensors. In one application, MEMS devices are formed with micro-channels in a substrate and layered devices for use in chemical and biological analysis according to the channel dimensions.

MEMS devices further comprise electronic components in the form of integrated circuit devices formed on the same silicon chip as a mechanical MEMS device. Advantageously, MEMS devices reduce the size and weight of mechanical and electromechanical systems when compared with conventional mechanical systems.

Fabrication of MEMS devices employs many of the same processing steps as the fabrication of integrated circuits. In particular, the formation of a MEMS device involves depositing and patterning thin films on a substrate surface, such as a silicon wafer surface, to produce complex microstructures. Common thin film materials (applied with a thickness on the order of micrometers or less) include silicon dioxide, silicon nitride, polycrystalline silicon (poly), amorphous silicon, aluminum, refractory metals and suicides. To provide mechanical movement for MEMS devices, it is necessary to decouple the structural elements to form a gap between the moving elements. Thus a selective etch process is used to form the gap by removing material without affecting the operative structures.

After depositing a material layer, photolithographic masking, patterning and etching steps are employed to remove the unwanted material. Generally, etch processes fall into two categories, wet etching and dry etching. According to a wet etch chemistry, the structure is immersed in or exposed to a liquid chemical bath containing an etchant solution, for example a buffered HF solution, until the unwanted material has been removed. For more effective wet etching, the wafer is mechanically or ultrasonically agitated during immersion in the etchant bath. Wet etching requires contact between the material layer to be removed and the etchant solution. The contact occurs along one or more exposed surfaces or edges of the material layer. If the surface or edge is not sufficiently accessible to the etchant, an opening may be formed in the overlying layers, extending down to the material layer, providing a path along which the etchant may flow to contact and etch the material. Following completion of the wet etch process the wafer is rinsed and spun dry.

Generally, etchants are subdivided into two broad categories, referred to as isotropic etchants and anisotropic etchants. Wet isotropic etchants, which are available for silicon dioxide, nitrides, aluminum, polysilicon, gold, and silicon, attack the material at the substantially the same rate in all directions, removing material vertically and horizontally under the photolithographic etch mask. In some applications, significant undesirable horizontal etching, referred to as undercutting, can occur during the isotropic etch process. Anisotropic etchants attack the material layers at different rates in different directions and may be applied to achieve greater control or geometric selectivity during the material removal process.

In addition to geometric selectivity, etchants are also material selective, that is, a specific etch chemistry etches different materials at different etch rates. For example, hydrofluoric acid (HF) etches silicon dioxide without significantly attacking silicon. However, wet etchants that are effective in removing silicon dioxide and silicon generally do not exhibit satisfactory selectivity to preserve metals, such as aluminum. Generally, in the fabrication of integrated circuit devices and MEMS structures, it has been difficult to remove silicon or silicon dioxide without substantially eroding adjacent aluminum or other metallized features.

Dry etch processes typically use a gas as the primary etchant without accompanying wet chemicals or rinses. Some dry etch processes are less aggressive than wet processes, allowing the formation of smaller and more delicate structures on the wafer surface due to the decreased risk of structure damage.

Downstream plasma etching, one type of dry etching, applies plasma energy to a gas, initiating a chemical reaction that performs the material etching. A plasma etching system comprises a chamber, vacuum system, gas supply, power supply and microwave source (or another suitable radio frequency signal source). Wafers are loaded into the chamber and positioned on a grounded platen disposed below a microwave-energized electrode. The chamber pressure is reduced to establish a vacuum and a gas (or a combination of gasses) is introduced into a microwave plasma tube. For example, when etching silicon dioxide, CF4 is mixed with oxygen, which serves as a passivating agent. As the gas mixture flows into the chamber, the microwave source supplies energy to the plasma tube, dissociating the CF4 into a cloud of fluorine and carbon radicals. In this state, the fluorine attacks and etches the silicon dioxide, converting it to volatile components that are removed from the chamber by the vacuum system.

In addition to material and directional selectivity mentioned above, a limitation common to both wet and dry etch techniques is the inability to compensate for etch rate variations due to dimension and size variations, i.e., variations in line density, critical dimension, open area percentage and layer thickness, in the structure to be etched. For example, a substrate area with large critical dimensions generally experiences a higher etch rate than a region with small critical dimensions. In general, areas with higher etch rates will etch through a material layer, and begin to etch an underlying layer in advance of regions having slower etch rates. To overcome this difficulty, the duration of an etch process is typically determined by the etch rate of the region experiencing the slowest etch rate, thereby achieving complete removal of the material to be etched. Also, non-critical features are compensated in the physical layout to account for the etch rate variations based on feature size to achieve the desired final feature size.

FIGS. 1A, 1B and 2 illustrate a prior art process for forming a MEMS device on a silicon substrate 10. As shown in FIG. 1A, a sacrificial layer 12 (conventionally silicon dioxide) is formed over the substrate 10. The MEMS device is formed in an overlying structural layer 14 (conventionally polysilicon). In this example, the structural layer 14 is masked, patterned, and etched to produce an elongated member 15, as illustrated in the top view of FIG. 1B. Any of the known dry or wet etching processes can be employed to form the elongated member 15 from the structural layer 14. The wafer then undergoes a wet etch to remove a significant portion of the sacrificial layer 12, freeing the elongated member 15 to form a cantilevered beam 16, as illustrated in FIG. 2. The wafer is removed from the etch bath before the entire sacrificial layer 12 is etched away, such that a region 12A remains as support for the cantilevered beam 16. Thus the removal of a portion of the sacrificial layer 12 decouples the elongated member 15 from the substrate 10, allowing the cantilevered portion of the beam 16 to move relative to the substrate 10.

MEMS devices comprising partially enclosed chambers can also be fabricated on the surface of the substrate 10, as illustrated in FIGS. 3A, B, C and D. A sacrificial layer is deposited over the substrate 10 and etched to form a sacrificial mesa 20 that defines a volume for the MEMS chamber. See FIG. 3A. A polysilicon layer 22 is deposited over the substrate 10 and the mesa 20 as illustrated in FIG. 3B. Next a window 24 is etched (conventionally by dry reactive ion etching) through the polysilicon layer 22. See FIG. 3C. The wafer is then immersed in a wet etch solution, removing the mesa 20 and leaving a windowed chamber 26.

According to the prior art, etch material selectivity issues can limit the materials of MEMS structures and integrated circuit devices, as known etch chemistries may not exhibit sufficient selectivities for preferred candidate materials. Providing etchant access to sacrificial layers can also be problematic as etch contact with the sacrificial layer requires access through a suitably sized opening or along an edge of the substrate.

BRIEF SUMMARY OF THE INVENTION

A process for selectively etching a material layer formed in a structure is described. A fluorine-based plasma is formed and the structure temperature is maintained at greater than about 100° C. The material layer is etched by exposure to the fluorine-based plasma through an opening extending from a surface of the structure to the material layer.

A structure comprising a plurality of material layers in stacked relation comprising a first material layer, a sacrificial layer and a second material. An opening in the first material layer extends to the sacrificial layer. An etchant introduced into the opening removes at least a portion of the sacrificial layer.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

FIGS. 11A and 11B illustrate plan and side views of a micro-mirror substrate; and FIGS. 12A and 12B illustrate plan and side views of a micro-mirror formed according to the teachings of the present invention.

BRIEF DESCRIPTION OF THE INVENTION

Figure 1A:
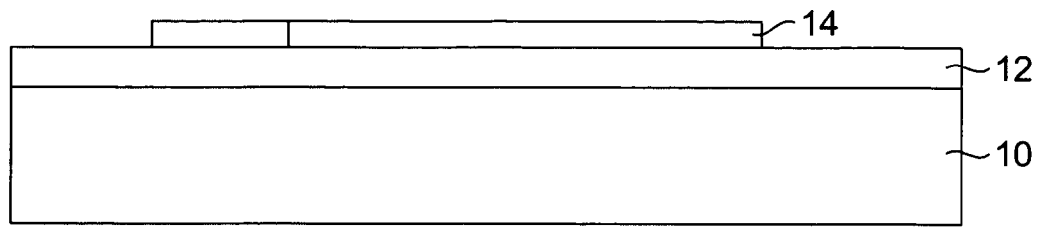
FIGS. 1A, 1B and 2 illustrate a prior art MEMS structure.
Figure 1B:
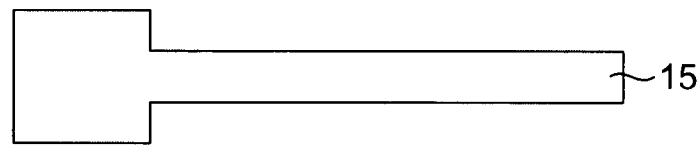
Figure 2:
Figure 3A:
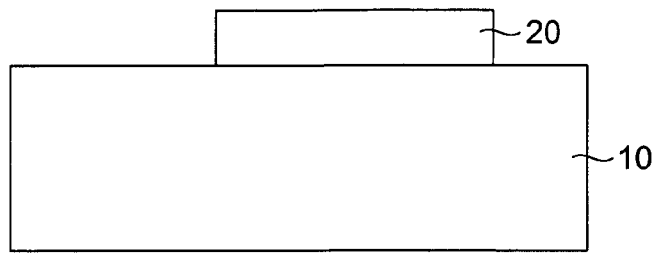
FIGS. 3A–3D illustrate a prior art MEMS structure during sequential processing steps.
Figure 3B:
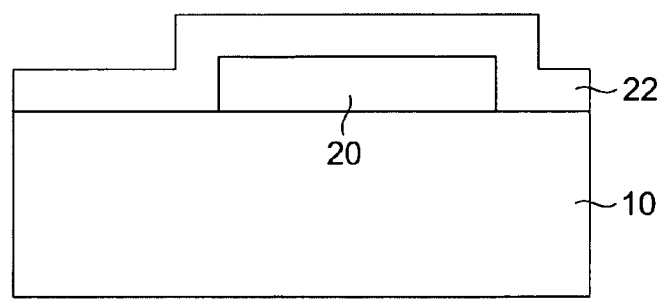
Figure 3C:
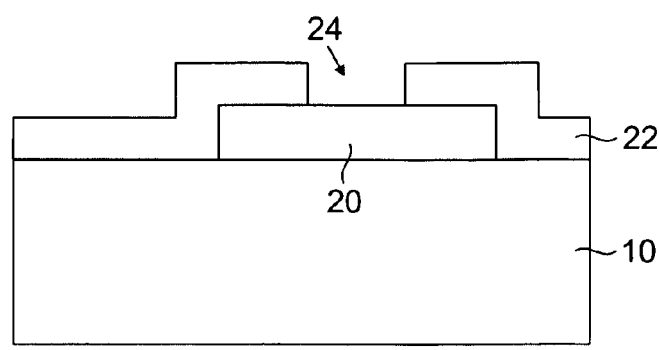
Figure 3D:
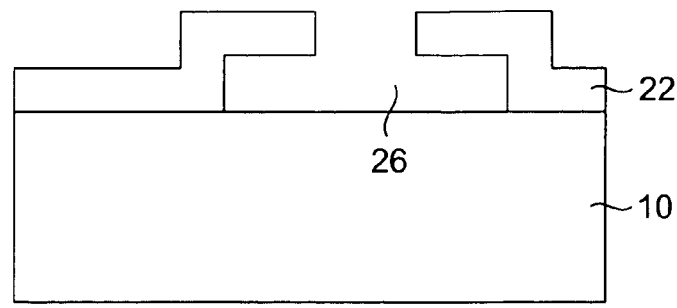

Before describing in detail the particular etch process in accordance with the present invention, it should be observed that the present invention resides primarily in a novel combination of elements and process steps. Accordingly, the elements have been represented by conventional elements in the drawings, showing only those specific details that are pertinent to the present invention so as not to obscure the disclosure with structural details that will be readily apparent to those skilled in the art having the benefit of the description herein.

Figure 4:
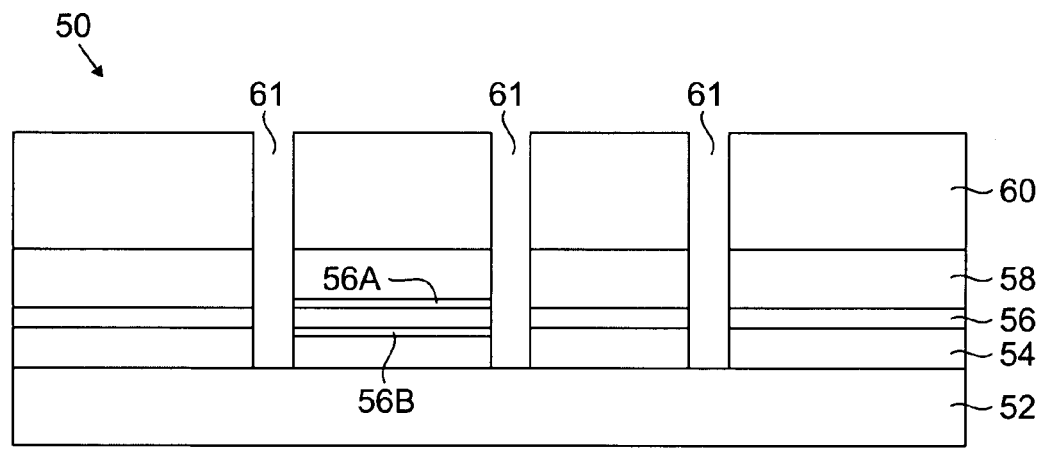
FIGS. 4–7 illustrate material substrates during sequential processing steps according to the teachings of the present invention.

FIG. 4 illustrates a layered structure 50 exemplary of a structure that is suitable for use in forming integrated circuit devices or MEMS devices. The structure 50 comprises, in stacked relation, a substrate 52, an aluminum layer 54, a sacrificial titanium nitride layer 56, a silicon dioxide layer 58, and a layer 60 formed from any one of several different material types, including silicon (in single crystal, amorphous, and polycrystalline form), silicon dioxide, silicon nitride and aluminum. The structure 50 further comprises a plurality of vias 61. As is known in the art, a via conventionally comprises a vertical opening or window having a generally circular or rectangular cross-section sized in accordance with its intended function, e.g., providing access to an underlying layer during an etch process or filled with a conductive material to provide a conductive interconnect structure between interconnect layers of an integrated circuit.

Figure 5:
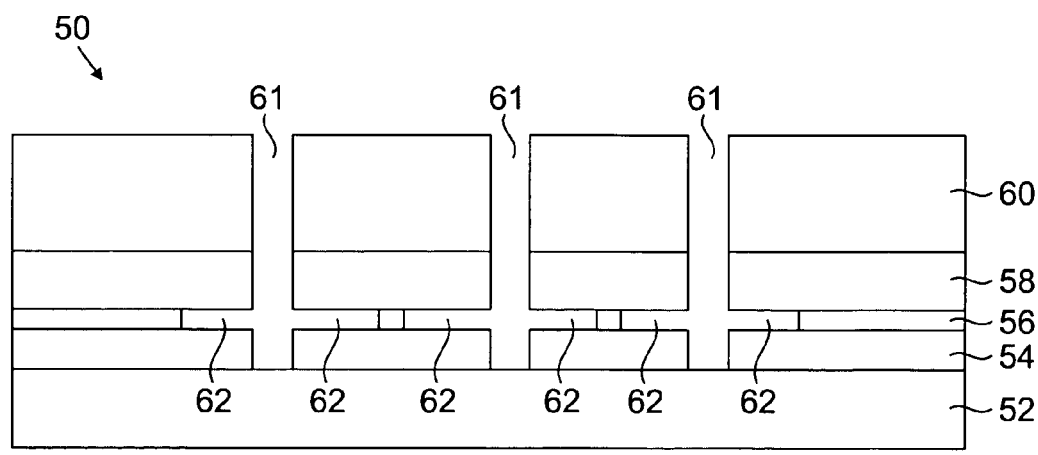

According to the teachings of the present invention, the structure 50 is exposed to plasma etchant of nitrogen trifluoride (NF3) at a low pressure (i.e., sub-atmospheric), in a range from about 500 mT to about 50,000 mT. The pressure can be varied to affect the results achievable according to the present invention. In one embodiment, a surface of the structure 50 is maintained at a temperature greater than about 100° C., with a preferred temperature of about 140° C. During the etching process the titanium nitride layer 56 is laterally etched through the vias 61, forming voids 62 as illustrated in FIG. 5. The exposure duration determines the amount of material removed and thus the lateral extent of the voids 62. Raising the exposure time etches more of the titanium nitride layer 56 and extends the voids 62. A sufficiently long exposure would cause the etchant to completely remove the titanium nitride layer 56. FIG. 5 illustrates several voids 62 within the structure 50, indicating that the process according to the present invention is consistent and repeatable.

As a result of the gaseous, low-pressure etch conditions of the present invention, sub-micron sacrificial layers, such as the titanium nitride layer 56, can be effectively removed as the etchant gas contacts the sacrificial layer through the vias 61. In one exemplary structure 50, the titanium nitride layer 56 is about 550 Angstroms thick.

In another embodiment, substantially horizontal trenches (not shown) in the structure 50 provide a flow path for the etchant gas to contact the sacrificial layer. Certain complimentary metal-oxide field effect transistor (CMOS) structures include trenches at the edge of the integrated circuit chip as a physical boundary and in certain photolithographic alignment structures. For a MEMS device, such trenches and other large area structures, would be common. Via openings and trenches providing contact to underlying trenches, allowing the formation of complex arrays of buried trenches, which are especially advantageous for MEMS devices used for chemical and biological applications and for sensors.

In another embodiment, the titanium nitride layer 56 is completely removed, permitting the upper structure, including the silicon dioxide layer 58 and the material layer 60, to flex upwardly to increase the vertical dimension of the void 62.

In yet another embodiment, the layer 56 is retained while layers 56A and 56B are removed, permitting the layer 56 to move between the layers 54 and 58.

Although described above with respect to a titanium-nitride sacrificial layer, in another embodiment the teachings of the invention are adaptable to remove material layers formed from elemental titanium and other titanium compounds and alloys. The process according to the present invention is also relatively highly material selective in that titanium-based layers can be removed without affecting adjacent aluminum, tungsten, silicon dioxide, silicon nitride and silicon (single crystal, amorphous, and polysilicon) material layers. The teachings of the present invention can also be applied to an exemplary process for fabricating MEMS structures. A titanium-based material serves as the sacrificial layer. The underlying material layer comprises silicon (e.g., silicon nitride or silicon dioxide) and the overlying layer comprises aluminum. Employing a process according to the teachings of the present invention, the sacrificial layer can be removed without adversely impacting the overlying or underlying layers. Since the present invention utilizes a gaseous etch process, it allows for the formation of more delicate and smaller dimension features that might be damaged or removed by a less selective wet etch process.

The invention can be employed to remove the sacrificial layer 12 in FIG. 1A. In this application the sacrificial layer 12 comprises titanium nitride, elemental titanium or another titanium alloy. The materials of the cantilevered beam 16 and the substrate 10 may comprise aluminum, silicon dioxide, silicon nitride, tungsten or silicon (single crystal, amorphous, or polysilicon). Thus in the manufacture of MEMS structures, the material selectivity properties of the present invention allow the use (and etching) of materials not heretofore usable in combination due to the lack of appropriate material selectivity in the etch process.

The material selectivity characteristics of the present invention also allow the use of such materials in the fabrication of integrated circuit devices. For example, a titanium nitride or titanium film can be etched without destroying adjacent layers comprised of aluminum, silicon dioxide, silicon nitride, tungsten or silicon (single crystal, amorphous, or polysilicon).

The aspect ratio of a via or opening is defined as the ratio of the structure height or thickness to the structure diameter or width. Known difficulties can be encountered when attempting to etch underlying layers through high aspect ratio openings, as there may be insufficient contact between the etchant in the high aspect ratio opening and the material layer to be removed. The process of the present invention can be successfully employed to etch material layers through high aspect ratio openings as the etch gas can penetrate into such openings due to the longer mean free path of the reactive ions in the low pressure nitrogen trifluoride (NF3) etch gas, as compared to the mean free path of other etch gasses. Aspect ratios of greater than about 50 are easily accommodated with the teachings of the present invention.

Figure 6:
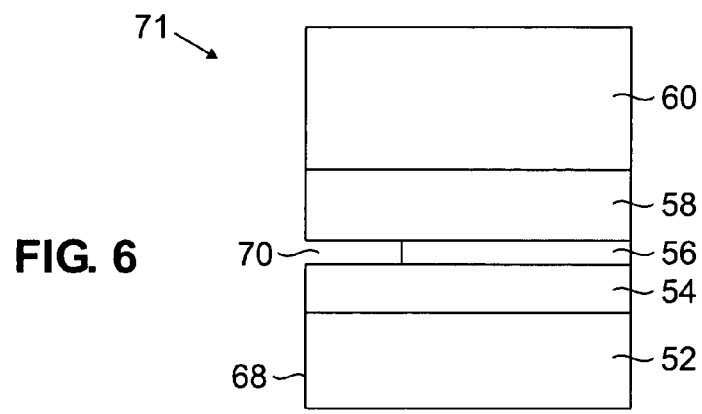

The process according to the present invention can also be employed to remove sacrificial layers not necessarily exposed through a structural opening (such as a void, trench or via, such as the vias 61 of FIGS. 4 and 5). In such an application, the etchant contacts the sacrificial layer at an exposed edge of the sacrificial layer. See FIG. 6 where a region 70 of the layer 56 is removed when the plasma contacts the layer 56 along an edge 68 of a structure 71.

The etch duration can be extended to completely remove the titanium nitride layer 56. The resulting void permits the mechanical separation of the aluminum layer 54 from the silicon dioxide layer 58. Thus these two layers are completely decoupled, a process that can be advantageously employed in the formation of MEMS devices and structures and also in the fabrication of semiconductor devices. In the latter application, a capacitor can be created by the formation of conductive material on the two opposing void surfaces, where the separation distance is controlled to determine the capacitance value. In the former application, MEMS micromachine elements, such as gears, require decoupling between two layers to permit structure movement.

According to other embodiments of the present invention other fluorine-containing chemistries can be used to etch the sacrificial layer. For example, $C_xF_y$ and $C_xH_yF_z$ chemistries can be adapted for use according to the teachings of the present invention.

Contact resistance in an integrated circuit device is a measure of the resistance between an interconnect structure, such as a conductive via, and a doped region of the substrate. Since a typical integrated circuit includes a substantial number of such contacts, the total interconnect resistance can be significantly reduced by reducing the resistance of each contact. According to the prior art, the contact resistance is reduced by increasing the contact surface area, i.e., enlarging the conductive via cross-section. But increasing the via size disadvantageously increases the overall device size. According to one embodiment of the present invention a reduced contact resistance can be formed in an integrated circuit device as follows.

Figure 7A:
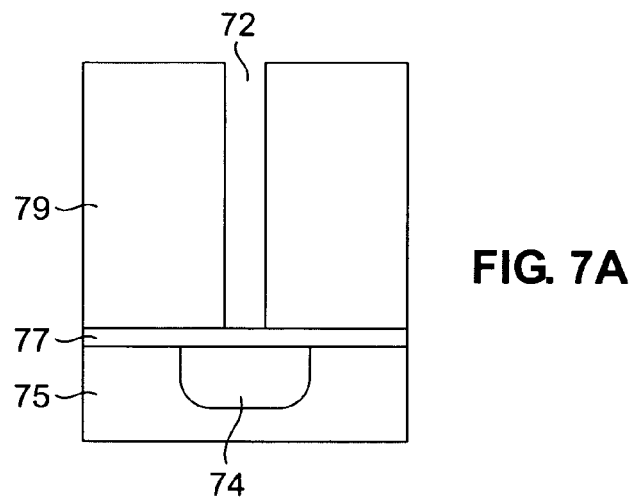

As illustrated in FIG. 7A, a via 72 is formed over a doped region 74 of a substrate 75. According to the prior art, the via 72 is filled with conductive material to form a conductive via in electrical contact with the doped region 74. An upper surface of the conductive via is connected to other interconnect structures of the integrated circuit. The contact resistance between the conductive via and the doped region 74 is determined in part by the contact surface area.

Figure 7B:
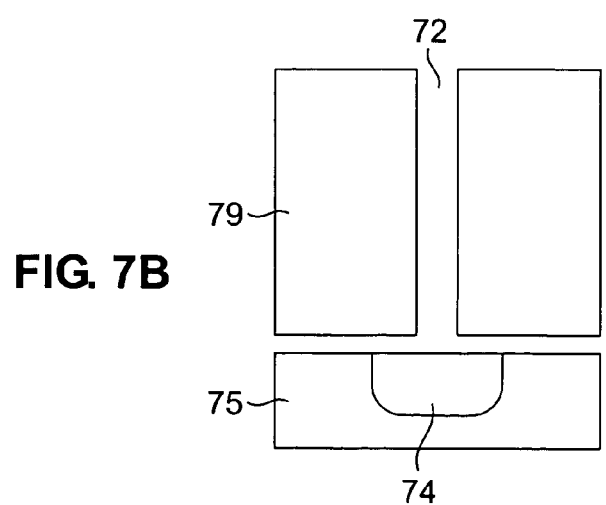
Figure 7C:
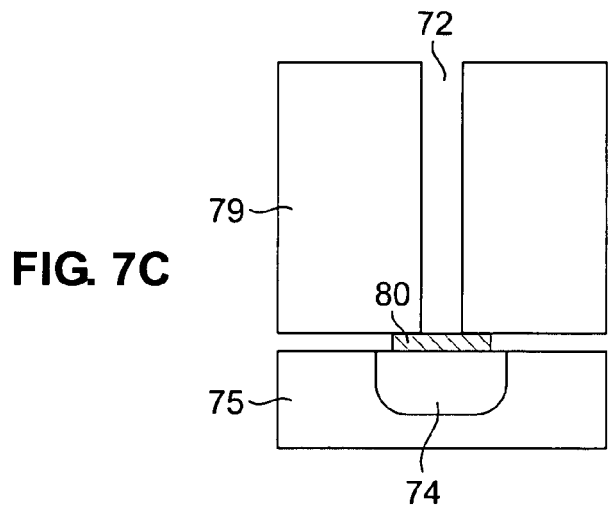

According to the teachings of the present invention, after formation of the via 72 a region of a sacrificial layer 77 is removed by etching as described above. If the sacrificial layer 77 is also present in other regions of the substrate 75, these regions can be protected from exposure to the etchants. The etchant contacts the sacrificial layer 77 through the via 72 or along an edge 79 to remove the layer 77 as shown in FIG. 7B. A conductive interface 80 (see FIG. 7C) is formed within an opening created by removal of the sacrificial layer 77. Since the conductive interface 80 presents a larger contact area with the doped region 74 than the contact area of a conductive via, the contact resistance is lowered without increasing the device size. The via 72 is then filled with conductive material (such as tungsten) according to known process steps.

Figure 8A:
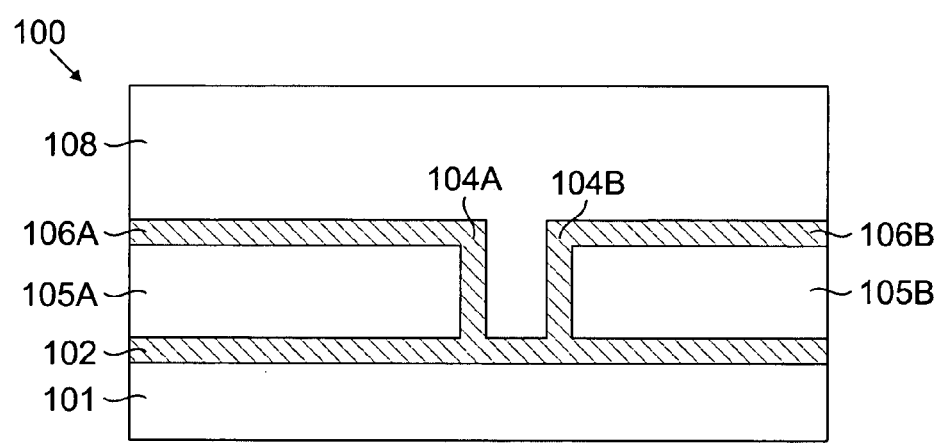
FIGS. 8A–8D illustrate the formation of a reentrant feature according to the teachings of the present invention.

In yet another embodiment, the teachings of the present invention can be employed to form a re-entrant feature profile for a microelectronics or MEMS device. A structure 100 is illustrated in FIG. 8A, including a silicon dioxide layer 101, a titanium-nitride layer 102, titanium-nitride segments 104A and 104B, aluminum interconnect layers 105A and 105B, titanium layers 106A and 106B, and a silicon dioxide layer 108.

Figure 8B:
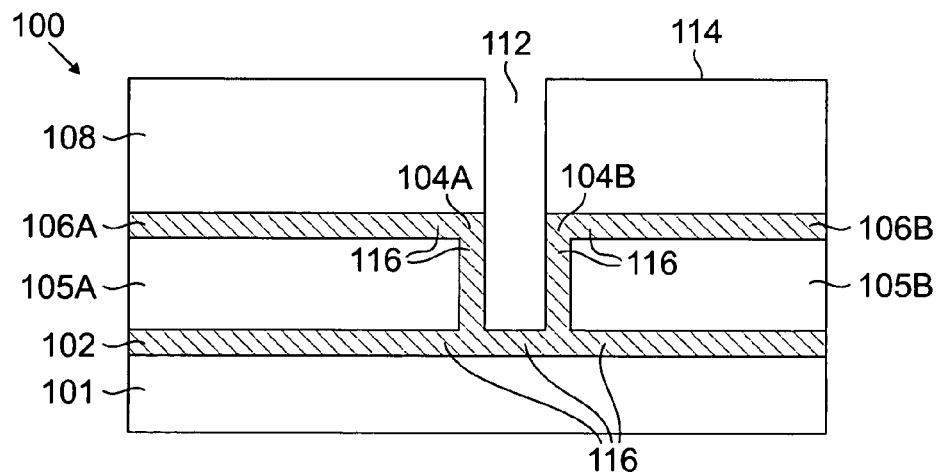
Figure 8C:
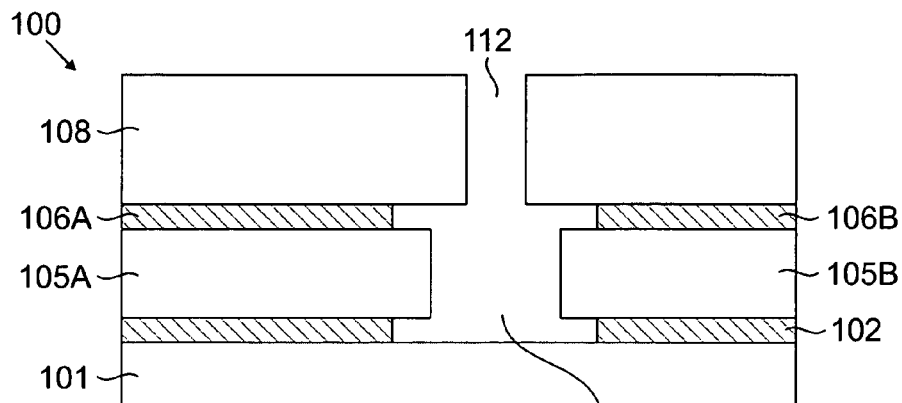

A via 112, formed by conventional processing, extends from an upper surface 114 of the silicon dioxide layer 108 to the titanium-nitride layer 102 as illustrated in FIG. 8B. The teachings of the present invention are employed to etch regions 116 of the titanium-nitride layers 102 and 106, forming a reentrant feature 118. See FIG. 8C. The etch duration determines the amount of titanium-nitride removed and thus the reentrant feature size.

Figure 8D:
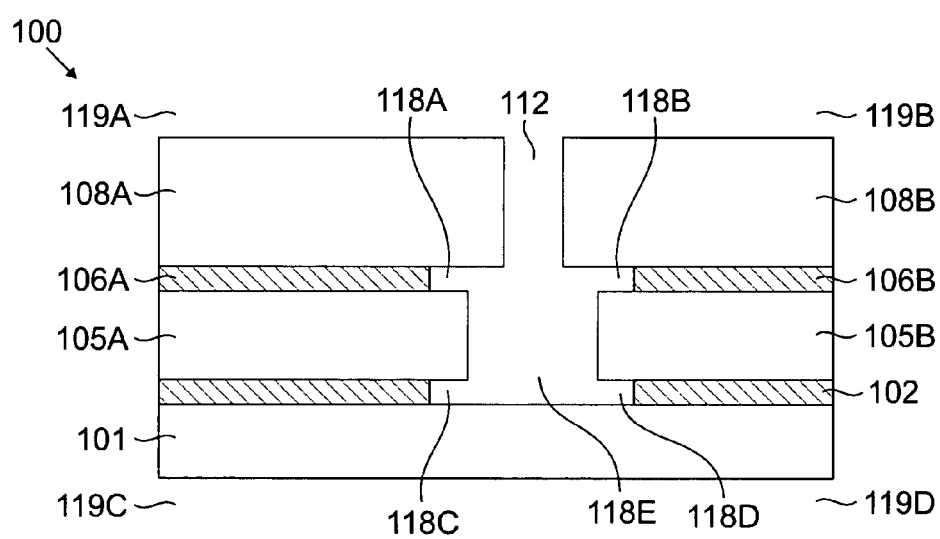
Figure 9A:
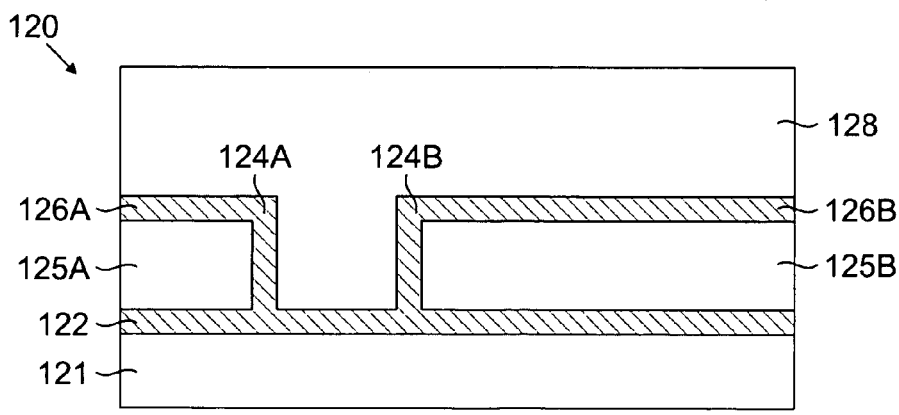
FIGS. 9A–9C illustrate the formation of a lever arm according to the teachings of the present invention.

Conductive material can be deposited within the reentrant feature 118 to form one or more capacitors. For example, silicon dioxide layers 108A and 108B can operate as capacitive dielectric materials, each operative with plates formed in regions 118A and 118B, where a portion of the titanium-nitride layers 106A and 106B has been removed as described above. See FIG. 8D. A second plate for each capacitor is formed in regions 119A and 119B, overlying the silicon dioxide layers 108A and 108B, respectively. A second pair of capacitors are formed by conductive material disposed in regions 119C and 119D underlying the silicon dioxide layer 101, which serves as the capacitive dielectric material. Opposing plates for the second pair of capacitors are formed in regions 118C and 118D, where portions of the titanium-nitride layer 102 have been removed. In yet another capacitor configuration, the aluminum interconnect layers 105A and 105B serve as capacitor plates with a dielectric material therebetween in a region 118E. One suitable dielectric material comprises air. In other embodiments, a dielectric material can be formed in the region 118E to serve as a capacitive dielectric. The capacitors described above provide a range of capacitance values depending on the characteristics of the various elements, including the dielectric material and the plate spacing. Generally, a capacitance of the last mentioned configuration is relatively small and can thus be used to tune other capacitors formed on the substrate by adding or subtracting a small capacitance therefrom. Capacitors so formed can also operate as sensing devices within microelectromechanical devices. Further, recognizing that FIG. 8D illustrates a vertical cross-sectional view, the various conductive and dielectric layers of the capacitor can extend into the plane of the paper, including extending in a serpentine or meandering configuration, to affect the physical dimensions, configuration and capacitance of the capacitor In a MEMS application, a lever arm of an accelerometer can be formed in an isolated cavity. A structure 120 is illustrated in FIG. 9A, including a silicon dioxide layer 121, a titanium-nitride layer 122, titanium-nitride segments 124A and 124B, aluminum layers 125A and 125B, titanium layers 126A and 126B, and a silicon dioxide layer 128. Although several of the inventive embodiments have been described with reference to material layers such as those illustrated in FIG. 9A, those skilled in the art recognize that the teachings of the present invention can be employed with other material layers having configurations and orientations other than those illustrated herein.

Figure 9B:
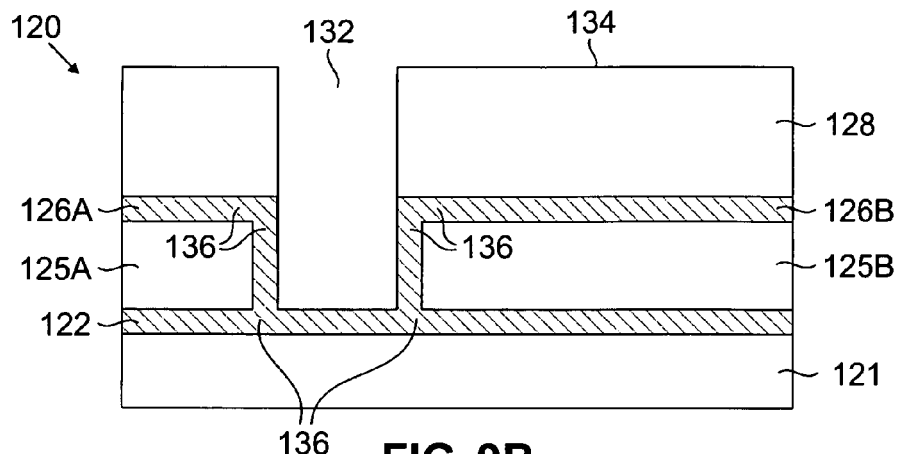

A via 132, formed by conventional processing, extends from an upper surface 134 of the silicon dioxide layer 128 to the titanium-nitride layer 122 as illustrated in FIG. 9B. The teachings of the present invention are employed to etch regions 136 of the titanium-nitride layers 122, 126A and 126B, forming a lever arm 137 of FIG. 9C. The etch duration determines the amount of titanium-nitride removed and thus the free length of the lever arm 137.

Figure 10:
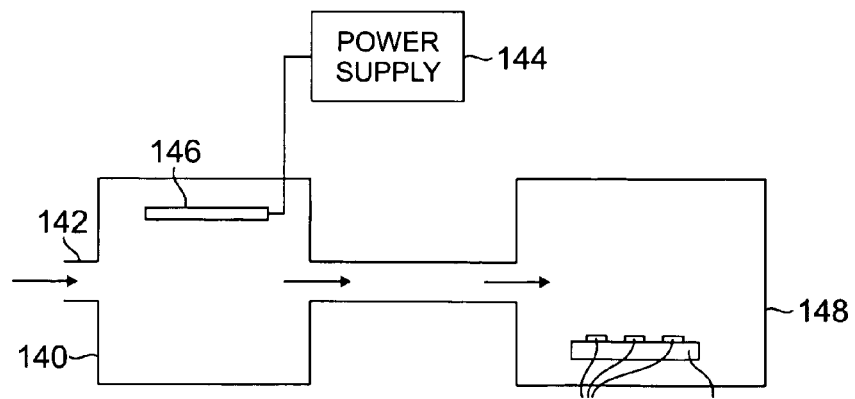
FIG. 10 illustrates a plasma-etching chamber for use in accordance with the teachings of the present invention.

FIG. 10 illustrates a plasma chamber 140, suitable for use according to the present invention, having an inlet 142 for receiving nitrogen trifluoride from a gaseous supply. A power supply 144 provides radio frequency energy to an electrode 146 for creating a plasma of nitrogen trifluoride within the chamber 140. When the plasma is formed the nitrogen and fluorine disassociate. The plasma chamber 140 is maintained at a subatomic pressure range from about 500 mT to about 50,000 mT. In an alternative embodiment an inert carrier gas, such as helium or argon, can be added to the gas flow through the inlet 142. The plasma is supplied to a reaction chamber 148 (maintained at a pressure from about 500 to about 3500 mT) where one or more wafers 150 are disposed on a platform 152. The plasma temperature upon entering the reaction chamber is in the range from about 100° C. to about 200° C. The wafers 150 are also maintained at a temperature between about 100° C. to about 200° C. The plasma selectively etches titanium or titanium-nitride sacrificial films, such as the titanium-nitride layer 56 of FIG. 4, as described above.

Although described above with respect to titanium-nitride layers, the process according to the present invention can be employed in various embodiments to remove a sacrificial layer of titanium, titanium-nitride or another titanium compound or alloy from between: two silicon layers (e.g., polysilicon, amorphous silicon and single-crystal silicon, including silicon compounds), two silicon dioxide layers, two silicon nitride layers, two aluminum layers (including elemental aluminum and aluminum compounds and alloys), two tungsten layers or any combination of these materials. The etching process according to the present invention is selective to remove only the titanium-based layer, leaving the other material layers intact. Further, the process is effective to etch material through openings, including high-aspect ratio openings.

Exemplary etch ratios for the various materials referred to herein based on known etch chemistries include: titanium: silicon: greater than about 10:1; titanium:silicon dioxide: greater than about 10:1; titanium nitride:aluminum: greater than about 50:1; titanium:silicon nitride: greater than about 10:1. The etch selectivity provided by the present invention reduces the effects of an over etch condition.

Figure 9C:
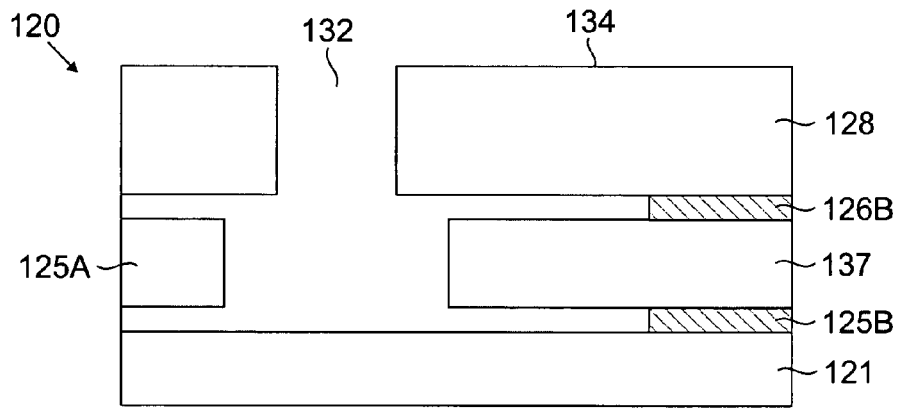

In one application of the present invention, a MEMS structure, such as the lever arm 137 illustrated in FIG. 9C, can be formed of aluminum on a substrate carrying integrated circuit active devices. Since the aluminum can be deposited on the substrate at temperatures below about 400° C., the previously-formed integrated circuit devices are not adversely affected during the aluminum deposition process.

To form such a MEMS structure, one or more sacrificial layers are deposited and patterned after formation of the active circuit devices in the substrate material. The aluminum is deposited and the techniques of the present invention are employed to remove the sacrificial layers disposed between the aluminum and the underlying substrate, forming a MEMS structure. The process of etching the sacrificial layer or layers can be accomplished, as described above, through relatively small aspect ratio openings, through trenches in the substrate or by etch exposure of the sacrificial layer at an edge surface of the substrate. Thus the present invention provides an enabling technology for forming MEMS devices from aluminum on the same substrate as integrated circuit devices.

In another embodiment, micro-mirror structures can be formed on an integrated circuit substrate according to this technique. FIGS. 11A and 11B illustrate a top and side view, respectively, of a micro-mirror 160 comprising a mirror material 162 disposed overlying a titanium-nitride material layer 164 and a substrate 166. The micro-mirror 160 is exposed to a titanium-nitride etch process according to the teachings of the present invention through an opening 167 in the substrate 166 to remove the titanium-nitride layer 164. The resulting structure is illustrated in FIGS. 12A and 12B. A gap 168 formed by removal of the titanium-nitride layer 164 permits a movable or pivotable portion 170 of the mirror material 162 to controllably rotate or pivot about arms 171 according to techniques known in the art.

Advantageously, the implementation of the etching process of the present invention at a relatively low temperature enables the formation of MEMS structures proximate integrated circuit devices, in that the low temperature etching process does not impact the previously formed integrated circuit devices. Temperature sensitive materials that could be damaged by high temperature steps in prior art MEMS processes can be employed to form MEMS devices according to the teachings of the present invention since high temperature steps can be avoided.

A process has been described as useful for etching layers of a substrate. While specific applications and examples of the invention have been illustrated and discussed, the principles disclosed herein provide a basis for practicing the invention in a variety of ways and in a variety of integrated circuit and MEMS structures. Numerous variations are possible within the scope of the invention. The invention is limited only by the claims that follow.

What is claimed is:

1. A process for selectively etching a material layer formed in a structure, comprising:
    forming a plasma from a fluorine-containing gas;
    maintaining the structure temperature at greater than about 100° C.;
    forming an opening extending from a surface of the structure to at least the material layer, wherein the material layer is exposed on a sidewall of the opening;
    exposing the material layer to the plasma through the opening; and
    etching the material layer by allowing plasma to contact the material layer through the opening for removing at least a portion of the material layer that is exposed on the sidewall of the opening, wherein any material remaining after the etching step is laterally disposed relative to the opening, wherein the material layer is selected from among titanium, titanium-nitride, a titanium compound and a titanium alloy.

2. The process of claim 1 wherein the fluorine-containing gas comprises NF3.

3. The process of claim 1 wherein the opening is selected from among a substantially vertical via opening and a substantially horizontal trench opening.

4. The process of claim 1 wherein the opening exhibits a relatively high aspect ratio of at least about 50:1.

5. The process of claim 1 wherein the step of exposing further comprises adjusting an exposure duration to control an extent of the material layer etch.

6. The process of claim 1 wherein the material layer comprises a sacrificial layer.

7. The process of claim 1 wherein the structure comprises layers selected from among silicon dioxide, polycrystalline silicon, amorphous silicon, single-crystal silicon, silicon nitride, tungsten, elemental aluminum and aluminum alloys.

8. The process of claim 1 wherein the step of maintaining the structure temperature further comprises maintaining the structure temperature between about 100° C. and 200° C.

9. The process of claim 1 wherein the structure comprises an overlying and an underlying layer with the material layer disposed therebetween, and wherein the material layer comprises a sacrificial layer, and wherein after the exposing step the overlying and the underlying layers are decoupled.

10. The process of claim 1 wherein the structure comprises an overlying and an underlying layer, and wherein the material layer comprises a sacrificial layer, and wherein after the exposing step one or more regions of the material layer are removed.

11. The process of claim 1 wherein the step of forming the plasma further comprises forming the plasma at a sub-atmospheric pressure in the range of about 500 mT to about 50,000 mT.

12. A process for selectively etching a sacrificial layer formed in a structure comprising a microelectromechanical device and one or more semiconductor devices, the process comprising;
    forming a plasma etchant from a fluorine-containing gas;
    maintaining the structure temperature at greater than about 100° C.;
    forming an opening extending from a surface of the structure to the sacrificial layer, wherein the sacrificial layer is exposed on a sidewall of the opening; and
    exposing the sacrificial layer to the plasma etchant through the opening for removing regions of the sacrificial layer without compromising the integrity of the semiconductor devices, wherein at least a portion of the sacrificial layer material that is exposed on the sidewall of the opening is removed and any remaining sacrificial layer material is laterally disposed relative to the opening, wherein the sacrificial layer is selected from among titanium, titanium-nitride, a titanium compound and a titanium alloy.

13. The process of claim 12 wherein the opening exhibits a relatively high aspect ratio of at least 50:1.

14. The process of claim 12 wherein the step of maintaining the structure temperature further comprises maintaining the structure temperature between about 100° C. and 200° C.

15. The process of claim 12 wherein the micromechanical device comprises an overlying and an underlying layer with the material layer disposed therebetween and wherein the material layer comprises a sacrificial layer, and wherein after the exposing step the overlying and the underlying layers are decoupled.

16. A process for selectively etching a sacrificial layer formed in a structure comprising a microelectromechanical device and one or more semiconductor devices, the process comprising:
    forming a plasma etchant from a fluorine-containing gas;
    maintaining the structure temperature at greater than about 100° C.;
    forming an opening extending from a surface of the structure to the sacrificial layer;

exposing the sacrificial layer to the plasma etchant to remove regions of the sacrificial layer without compromising the integrity of the semiconductor devices, wherein at least a portion of removed regions of the sacrificial layer are laterally disposed relative to the opening and wherein an etch ratio of the etchant is at least 10:1 wherein the sacrificial layer is selected from among titanium, titanium-nitride, a titanium compound and a titanium alloy.

17. The process of claim 16 wherein the microelectromechanical device comprises in stacked relation first, second and third material layers and wherein the second material layer comprises and is selected from among titanium, titanium-nitride and a titanium alloy.

18. The process of claim 17 wherein the first and the third material layers are selected from among silicon dioxide, polycrystalline silicon, amorphous silicon, single-crystal silicon, silicon nitride, tungsten, elemental aluminum and aluminum alloys.

19. A process for forming a contact between a conductive via and a doped region formed in a semiconductor substrate, comprising:
    forming a sacrificial layer overlying the doped region;
    forming a material layer overlying the sacrificial layer;
    forming an opening in the material layer, wherein the opening exposes a region of the sacrificial layer;
    etching at least a portion of the sacrificial layer disposed laterally with respect to the opening;
    forming a conductive material in the etched portion of the sacrificial layer; and
    forming conductive material in the opening.

20. The process of claim 19 wherein the step of etching further comprises:
    forming a plasma from a fluorine-containing gas;
    maintaining the substrate temperature at greater than about 100° C.; and
    exposing the sacrificial layer to the plasma to etch the sacrificial layer.

21. The process of claim 20 wherein the step of exposing further comprises exposing the sacrificial layer to the plasma through the opening.

22. The process of claim 19 wherein the opening exhibits a relatively high aspect ratio of at least about 50:1.

23. A process for forming a reentrant feature in a substrate, comprising:
    forming the substrate comprising in stacked relation, a first material layer, a first sacrificial layer, a second material layer, a second sacrificial layer, and a third material layer;
    forming a substantially vertical region of sacrificial material in the second material layer bridging the first and the second sacrificial layers;
    forming an opening through the third material layer, the second sacrificial layer and the second material layer, wherein the opening is bounded by the bridging sacrificial material and exposes the first sacrificial layer;
    laterally etching by plasma containing fluorine-containing gas a portion of the first and the second sacrificial layers proximate the opening and vertically etching the bridging sacrificial material.

24. The process of claim 23 wherein the step of etching further comprises exposing the substrate to a fluorine-containing gas.

25. The process of claim 23 wherein the opening exhibits a relatively high aspect ratio of at least about 50:1.

26. The process of claim 23 wherein the material of the first and the second sacrificial layers and the bridging sacrificial layer is selected from among titanium, titanium-nitride, a titanium compound and a titanium alloy.

27. The process of claim 23 wherein the material of the first, second and third material layers is selected from among silicon dioxide, polycrystalline silicon, amorphous silicon, single-crystal silicon, silicon nitride, tungsten, elemental aluminum and aluminum alloys.

28. The process of claim 23 wherein the etching step further comprises maintaining the substrate between about 100° C. and 200° C.

29. The process of claim 23 wherein the first material layer comprises a dielectric material layer, the process further comprising;
    forming a first capacitor plate in an etched region of the first sacrificial layer; and
    forming a second capacitor plate underlying the first material layer, wherein the dielectric material layer intermediate the first and the second capacitor plates comprises a capacitor dielectric.

30. The process of claim 23 wherein the second material layer comprises a dielectric material layer, the process further comprising;
    forming a first capacitor plate in an etched region of the second sacrificial layer; and
    forming a second capacitor plate overlying the third material layer, wherein the dielectric material layer intermediate the first and the second capacitor plates comprises a capacitor dielectric.

31. The process of claim 23 wherein the second material layer comprises first and second portions separated by the opening, and wherein the second material layer comprises a conductive material layer, arid wherein the first and the second portions operate as first and second capacitor plates, and wherein a capacitor dielectric comprises a region from which the bridging sacrificial material has been etched.

32. The process of claim 31 further comprising forming a dielectric material in the region from which the bridging sacrificial material has been etched, wherein a capacitance of the capacitor is responsive to the dielectric material.

* * * * *